(12) United States Patent
Dernier

(10) Patent No.: US 9,717,153 B2
(45) Date of Patent: Jul. 25, 2017

(54) FOR RETENTION BASE TO FIXTURE ON COVER REMOVAL FIXTURE

(75) Inventor: William Philip Dernier, Indianapolis, IN (US)

(73) Assignee: THOMSON LICENSING, Issy-les-Moulineaux (FR)

( * ) Notice: Subject to any disclaimer, the term of this patent is extended or adjusted under 35 U.S.C. 154(b) by 0 days.

(21) Appl. No.: 14/131,718

(22) PCT Filed: Jul. 16, 2012

(86) PCT No.: PCT/US2012/046836
§ 371 (c)(1),
(2), (4) Date: Mar. 28, 2014

(87) PCT Pub. No.: WO2013/012768
PCT Pub. Date: Jan. 24, 2013

(65) Prior Publication Data
US 2014/0290142 A1    Oct. 2, 2014

Related U.S. Application Data

(60) Provisional application No. 61/508,724, filed on Jul. 18, 2011.

(51) Int. Cl.
*H04N 7/16* (2011.01)
*H05K 5/02* (2006.01)
*H05K 5/00* (2006.01)

(52) U.S. Cl.
CPC ......... *H05K 5/0221* (2013.01); *H05K 5/0013* (2013.01)

(58) Field of Classification Search
CPC ...... G06F 1/1632; G06F 1/1616; G06F 1/181; G06F 1/184; G06F 1/185; G06F 1/186; H05K 7/142; H05K 7/1417; H05K 7/1461
USPC .............. 725/151; 361/679.57, 740, 759
See application file for complete search history.

(56) References Cited

U.S. PATENT DOCUMENTS

| 4,585,122 A | 4/1986 | Stegenga |
| 4,653,783 A * | 3/1987 | Steup ............... G11B 33/02 292/19 |
| 4,673,100 A * | 6/1987 | Reis ............... H05K 5/0013 220/284 |
| 5,453,912 A * | 9/1995 | Lytle ............... H04B 1/08 174/17 R |
| 5,551,589 A | 9/1996 | Nakamura |

(Continued)

FOREIGN PATENT DOCUMENTS

| CN | 101351094 | 1/2009 |
| EP | 0090921 | 10/1983 |

(Continued)

*Primary Examiner* — Michael B Pierorazio
(74) *Attorney, Agent, or Firm* — Richard LaPeruta; Jerome G. Schaefer

(57) ABSTRACT

A method and apparatus for disassembling a set top box is disclosed. The method includes providing the set top box including: a top cover, a base, and cover retention clips, wherein the cover retention clips are V or U shaped for securing the top cover to the base, providing a release fixture including a retention clip release finger, inserting the release fixture into the set top box, disengaging the cover retention clips using the retention clip release finger, and removing the top cover from the base.

15 Claims, 8 Drawing Sheets

(56) References Cited

U.S. PATENT DOCUMENTS

| | | | | |
|---|---|---|---|---|
| 5,636,535 | A * | 6/1997 | Shimada | E05B 73/0023 206/1.5 |
| 5,823,341 | A * | 10/1998 | Nakasuji | 206/387.11 |
| 5,835,799 | A | 11/1998 | Washisu | |
| 5,934,114 | A * | 8/1999 | Weisburn et al. | 70/57.1 |
| 6,094,785 | A * | 8/2000 | Montgomery | B25B 31/00 24/108 |
| 6,296,334 | B1 | 10/2001 | Liao | |
| 6,545,216 | B1 | 4/2003 | Bell et al. | |
| 6,567,360 | B1 * | 5/2003 | Kagawa | 720/609 |
| 6,659,797 | B2 | 12/2003 | Ichio | |
| 6,856,517 | B2 * | 2/2005 | Keating et al. | 361/796 |
| 6,920,976 | B2 * | 7/2005 | Sykes | E05B 73/0023 206/308.2 |
| 7,103,892 | B2 * | 9/2006 | Law | G11B 33/022 361/679.33 |
| 7,363,645 | B1 * | 4/2008 | Hendricks | 725/41 |
| D631,449 | S * | 1/2011 | Ritter et al. | D14/125 |
| 7,944,690 | B2 * | 5/2011 | Yamagiwa | H05K 5/0013 29/426.1 |
| 8,148,633 | B2 * | 4/2012 | Hung | 174/50 |
| 8,740,650 | B2 | 6/2014 | Huang et al. | |
| 8,752,911 | B2 | 6/2014 | Dernier et al. | |
| 8,902,601 | B2 * | 12/2014 | Trotman | H05K 7/1402 361/679.38 |
| 9,261,588 | B2 | 2/2016 | Kim et al. | |
| 2004/0264155 | A1 * | 12/2004 | Soule et al. | 361/818 |
| 2005/0219832 | A1 * | 10/2005 | Pawlenko | H05K 5/0013 361/818 |
| 2005/0227744 | A1 * | 10/2005 | Chiang et al. | 455/575.1 |
| 2006/0215357 | A1 * | 9/2006 | Green et al. | 361/678 |
| 2009/0148638 | A1 * | 6/2009 | Kishi et al. | 428/35.7 |
| 2009/0190291 | A1 | 7/2009 | Yamagiwa | |
| 2011/0115349 | A1 * | 5/2011 | Dernier | H05K 5/0013 312/223.1 |
| 2012/0187812 | A1 * | 7/2012 | Gerst | E05C 19/06 312/237 |
| 2012/0307455 | A1 * | 12/2012 | Ritter | H05K 7/20445 361/720 |
| 2013/0258576 | A1 * | 10/2013 | Ben-Gad | G06K 13/0806 361/679.32 |
| 2013/0301215 | A1 * | 11/2013 | Trotman | H05K 7/1418 361/679.58 |
| 2013/0347051 | A1 * | 12/2013 | Bose et al. | 725/151 |

FOREIGN PATENT DOCUMENTS

| | | | |
|---|---|---|---|
| EP | 0653534 | 5/1995 | |
| EP | 2086301 | 8/2009 | |
| FR | 2810018 | 12/2001 | |
| GB | 2282845 | 4/1995 | |
| JP | 58170584 | 11/1983 | |
| JP | 61030280 | 2/1986 | |
| JP | 01156586 | 10/1989 | |
| JP | 07027236 | 5/1995 | |
| JP | 07137779 | 5/1995 | |
| JP | 09261819 | 10/1997 | |
| JP | 2007005701 | 1/2007 | |
| JP | 2009176937 | 8/2009 | |
| JP | 2011528503 | 11/2011 | |
| WO | WO2010008360 | 1/2010 | |
| WO | WO 2010008360 A1 * | 1/2010 | H05K 5/0013 |

* cited by examiner

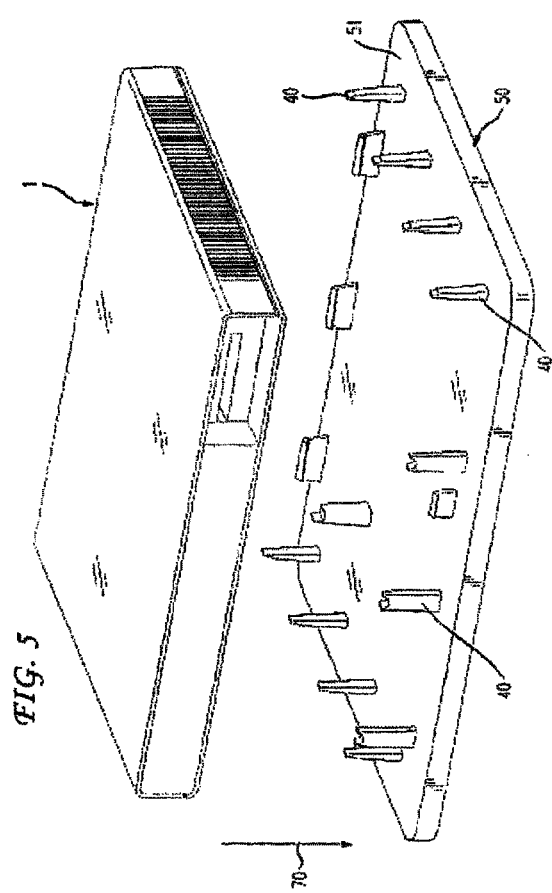

FOR RETENTION BASE TO FIXTURE ON COVER REMOVAL FIXTURE

CROSS REFERENCE TO RELATED APPLICATIONS

This application is a National Stage Application and claims the benefit, under 35 U.S.C. § 365 of International Application PCT/US2012/046836 filed Jul. 16, 2012 which was published in accordance with PCT Article 21(2) on Jan. 24, 2013 in English, and which claims the benefit of U.S. Provisional Pat. App. Ser. No. 61/508,724filed on Jul. 18, 2011.

BACKGROUND

Electronic apparatuses or devices such as set-top boxes can be assembled apparatuses having a plurality of walls wherein at least one of the walls can be secured with a plurality of screws. Unfortunately, gaining access to the interior components of these devices can require removing the plurality of screws which can often require excessive handling of the device. The excessive handling often can involve changing the orientation of the device, such as by turning the device upside down or placing it on its sides, to find each of the screws. This can then be followed by disassembling the device by removal of one screw at a time with the device being upside down or on its side. This excessive handling of the device can increase the chances of damaging the interior components because each motion of the device can jar the components. Additionally, the removal and reengaging of the screws can present an opportunity for scratching the device or stripping threads of the screws.

In light of the fact that interior components of electronic devices can often need to be accessed and that accessing the interior components can place the interior components at risk of damage or can place the electronic device at risk for scratches, a need can exist for an improved electronic device structure and method for opening the electronic device which is fast, simple, and safe.

To meet this need one known system is disclosed in WO2010008360A1. FIG. 1 is a perspective view of the apparatus according to WO2010008360A1 in a disassembled condition. An apparatus 1, such as a set top box, can comprise an enclosure having exterior walls defining an interior space, a top 10 having an interior surface 112 and a plurality of coupling clips 30 extending from the interior surface, and a base 5. The base 5 has an inner surface, a plurality of clip receiving members 20 extending from the inner surface which engage the coupling clips 30 to secure the top 10 to the base 5. The base 5 further includes at least one aperture 7 adapted to permit a release fixture 50 having a plurality of decoupling members 40 extending from a plate 51 to simultaneously disengage the clip receiving members 20.

The method of assembling the apparatus 1 according to WO2010008360A1 includes: pushing a base 5 and top 10 together by applying a vertical force; simultaneously contacting coupling clips 30 of the top 10 with clip receiving members 20 of the base 5; laterally repositioning grasping portions 31 of the coupling clips 30; and snapping the grasping portions 31 into their initial lateral positions or some intermediate positions. There can be a lateral and vertical overlap of portions of the coupling clips 30 and part of the clip receiving members 20 which can cause the top 10 and base 5 to be disassembled. The method can further include steps for dissembling the apparatus, including: aligning a release fixture to the base 5; applying a linear force to the release fixture 50 to cause a plurality of decoupling members 40 extending from a plate 51 of the release fixture 50 to enter apertures of the base 5; substantially contacting the decoupling members 40 to the grasping portions 31 simultaneously; laterally repositioning grasping portions 31 of the coupling clips 30 to disengage the grasping portions 31; and lifting off the top 10.

FIG. 1 shows the apparatus 1 according to WO2010008360A1 in a disassembled condition. The apparatus 1 can be an electronic apparatus such as a set-top box. The apparatus 1 can includes an enclosure having exterior walls defining an interior space. The enclosure can house various electronic components such as processors, smart card assemblies, tuners, fans, storage devices, etc. These components can be supported in an interior support structure 60 which itself can have side walls and a base. The exterior walls can be a front wall 8, rear wall 6, side walls 4, a top 10 and a base 5.

The base 5 has an inner surface 13 opposite the outer surface and facing the top 10. The base 5 further includes a plurality of clip receiving members 20 extending from the inner surface 13, which are designed to secure the base 5 to the top 10. The base 5 further includes a series of apertures 7 which are associated with the clip receiving members 20 and are adjacent or near the clip receiving members 20.

In one example, there is one aperture 7 for each clip receiving member 20. However, in other examples of WO2010008360A1, single apertures 7 can be associated with and used for multiple clip receiving members 20.

The top 10 of the apparatus 1 includes an exterior surface 11 and interior surface 112. The top 10 further includes a plurality of coupling clips 30 designed to engage or snap into the clip receiving members 20 of the base 5. The plurality of coupling clips 30 effectively secures the top 10 to the base 5.

The expression "snap" can imply either that some part of the coupling clips 30 and/or some part of the clip receiving members 20 are flexible or resilient to permit some lateral repositioning or motion of either part when a vertical force is applied pushing the base 5 and top 10 together to cause the coupling clips 30 and/or some portion of the clip receiving members 20 to contact. Further, lateral repositioning or motion can occur upon the contact and can increase as the coupling clips 30 and/or some portion of the clip receiving members 20 move further in opposite vertical directions with the force. The force finally causes the top 10 and base 5 to be in a predetermined assembled state. In terms of the separation dimension, the part of the coupling clip 30 or clip receiving members 20 which had been repositioned or moved can return to its initial lateral position or some intermediate position such that there is a lateral and vertical overlap of portions of the coupling clips 30 and/or part of the clip receiving members 20, for example, a shoulder. The lateral and vertical overlap of portion of the coupling clips and/or part of the clip receiving member can cause the top 10 and base 5 to be assembled or fixed together. The top 10 and base 5 cannot be separated in a nondestructive manner by opposite vertical forces that attempt to separate the top 10 and base 5. "Snapping" can often be assumed to imply rapid or immediate movement toward the initial state, however, the movement can be slow.

The interior support structure 60 can have holes or slots 9 which can be also associated with the apertures 7 to allow clearance for the clip receiving members 20.

FIGS. 2A and 2B are an exploded view of the coupling clips of the apparatus of FIG. 1. FIG. 2A shows a two-prong coupling clip 30 extending from the inner surface 12 of the top 10. Each prong has a grasping portion 31 at a distal end of a downwardly or inwardly extending portion 32. The grasping portion 31 can have a shoulder and a sloped side extending down or away from the end of the shoulder and forming an acute angle with the shoulder. The slope side can be curved with at least part of the surface forming an acute angle with the shoulder. In FIG. 2A, the shoulders of the grasping portions 31 extend away from one another.

FIG. 2B shows an example of a one-prong coupling clip 30. The one prong has a grasping portion 31 at a distal end of a downwardly or inwardly extending portion 32. The grasping portion 31 can also have a shoulder and a sloped side extending from the end of the shoulder downwardly or away from the inner surface 12. A portion of the sloped side can form an acute angle with the shoulder. The distal end can extend at least two different lengths from the top. Grasping portion 31 can extend in at least two different dimensions from the top, which can make it more difficult for unauthorized disassembly of the apparatus.

FIG. 3 is a perspective view of a coupling clip engaged in a clip receiving member of the assembled apparatus according to WO2010008360A1. FIG. 3 illustrates how the two-prong coupling clip 30 of FIG. 2A can engage the clip receiving member 20 of the base 5. Clip receiving member 20 extends from the base 5 and has a shoulder 21 at a distal end of an upwardly or inwardly extending part 22. FIG. 3 shows an example of an aperture 7 which can be formed in the base 5. Each aperture 7 can correspond to an engagement for coupling clip 30 with clip receiving member 20. The distal end of the upwardly or inwardly extending part 22 can refer to the location remote from the base 5 where the shoulders 21 of the clip receiving member 20 extends. The structure of the clip receiving member 20 can have additional parts or an extension that extends passed the shoulder. The distal end of the clip receiving member 20 can refer to a location remote from the base 5 where the shoulder 21 of the clip receiving member 20 extends.

FIG. 3 shows the grasping portions 31 snapped into the clip receiving member 20 by having the respective shoulders of the grasping portions 31 extending passed the shoulders 21 of the clip receiving members 20. The respective shoulders can overlap and be in contact with each other or in proximity to each other, thereby securing the top 10 to the base 5.

FIG. 3 also shows the front wall 8 being held into an assembled state by being positioned in slots 3 in the top 10 and base 5. This illustrates another feature of WO2010008360A1 which is that examples can include some or all of the walls being held into place by slots 3 in the top 10 and/or base 5. This feature can be advantageous because it can use fewer screws or no screws at all, which is an object of WO2010008360A1.

FIG. 4 is a perspective view of another coupling clip engaged in a clip receiving member of the assembled apparatus according to WO2010008360A1. FIG. 4 illustrates how the one-prong coupling clip 30 of FIG. 2B can engage the clip receiving member 20 of the base 5. FIG. 4 also shows an aperture 7 which can be formed in the base 5 and associated with the engagement of the illustrated coupling clip 30 and clip receiving member 20. An aperture 7 can also be slot cut or formed into the base 5. The clip receiving member 20 engages the coupling clip 30 the same way as that in FIG. 3.

A key feature of WO2010008360A1 can be that there is a plurality of coupling clip 30 and clip receiving member 20 engagements and that in a preferred example, the engagements during assembly can be performed substantially simultaneously. The expression simultaneously can be used to include situations where there can be some slack from one engagement to another. For example, the length of travel for one engagement can be 5% greater than the length on another engagement. The engagements being simultaneous can be advantageous because it can prevent twisting or tilting of the top 10 with respect to the base 5. Further elements of WO2010008360A1 can include only one-prong coupling clips 30 in the apparatus 1, only two-prong coupling clips 30, or a combination of both.

FIG. 5 is a perspective view of the assembled apparatus and a release fixture according to WO2010008360A1. FIG. 5 introduces another element of WO2010008360A1, where the apparatus can be designed to be easily disassembled by using a single tool in one simple and single linear motion 70 while the apparatus 1 is maintained in its normal operating orientation. The tool can be a release fixture 50 that has a plurality of decoupling members 40 extending from a plate 51 to simultaneously disengage the coupling clips 30 from the clip receiving members 20. The feature of having the disengagements being simultaneous can be advantageous because it can prevent twisting or tilting of the top with respect to the base 5. The decoupling members 40 are each designed to align with apertures 7 and contact the coupling clips 30. To disassemble the apparatus 1, the release fixture 50 is placed on a flat surface. The apparatus 1 is aligned with the release fixture 50, and then in one motion the apparatus 1 is placed and pushed toward the release fixture 50. The motion causes the decoupling members 40 to disengage the coupling clips 30 from the clip receiving members 20 as shown in FIGS. 6 and 7.

FIG. 6 is a cross-section of the apparatus and release fixture according to WO2010008360A1 during various steps of disassembly of the apparatus. FIG. 6 illustrates how the two-prong coupling clip 30 is disengaged during the single linear motion 70 in FIG. 5. FIG. 6A shows the decoupling member 40 as having a U-shape design with flat upper edges that contact the grasping portions 31 when the decoupling member 40 enters the aperture 7 and applies an upward or inward force 53. The upward or inward force 53 can cause the grasping portion 31 to shift in a direction 54 away from the upwardly extending part 22 such that the downwardly extending portion 32 bends and/or angles to a position where the shoulder of the grasping portion 31 clears or moves passed the shoulder 21 of the clip receiving member 20.

FIG. 6B shows the positioning of the grasping portion 31 when its shoulder clears or moves passed the shoulder 21 of the clip receiving member 20 and the decoupling member 40 is fully inserted. At this point, the top 10 can be removed by simply lifting it as shown in FIG. 6C. FIG. 6C shows the positioning of the grasping portion 31 of the coupling clips 30 when top 10 is lifted, allowing the components within the apparatus 1 to be accessed.

The assembly can be easily reassembled by simply placing the top 10 over the base 5 with the release fixture 50 removed and pressing the top 10 down or toward the base 5. Each of the coupling clips 30 can then be reengaged into the clip receiving members 20.

FIG. 7 is another cross-section of the apparatus and release fixture according to WO2010008360A1 during various steps of disassembly of the apparatus. FIG. 7 illustrates how the one-prong coupling clip 30 is disengaged during the single linear motion 70 in FIG. 5. FIG. 7A shows the decoupling member 40 as having a narrow edge which has a width the same dimension as the shoulder 21. The dimension is such that the narrow edge contacts the grasping portion 31 when the decoupling member 40 enters the aperture 7. The decoupling member can apply an upward or inward force 53 causing the grasping portion 31 to shift in a direction 54 away from the upwardly extending part 22 causing the downwardly extending portion 32 to bend and/or angle to a position where the shoulder of the grasping portion 31 clears or moves passed the shoulder 21 of the clip receiving member 20.

FIG. 7B shows the positioning of the grasping portion 31 of the one-prong coupling clip 30 when its shoulder clears or moves passed the shoulder 21 of the clip receiving member 20 and the decoupling member 40 is fully inserted. At this point, the top 10 can be removed by simply lifting it as shown in FIG. 7C. FIG. 7C shows the positioning of the grasping portion 31 of the coupling clips 30 when top 10 is lifted, thereby allowing the components within the apparatus 1 to be accessed.

Although WO2010008360A1 has its advantages over the prior art, WO2010008360A1 can be somewhat complicated and require coupling clips 30 to extend down from a horizontal interior portion of the top or outer cover 10. This in turn can imply that the interior circuit board and any other interior components can be designed to accommodate the coupling clips 30 and clip receiving members 20.

A need for a simpler design which provides many of the advantages of WO2010008360A1, but is more universal and does not require interior components (such as top broad heatsinks and circuit boards) to be specially designed to accommodate and fit around coupling clips and clip receiving members can exist. Additionally, a need for a design in which permits the top of the set top box to remain in a lateral position with respect to the frame and base of the set top box when it is unlatched and a means to secure or hold the set top as the top is removed can exist.

Other known methods can include: strong magnets that can require hands on both the base and the fixture to remove the base; latching devices that can require a second motion by the user to attach and detach the base from the fixture; and complex springs that push the cover from the base.

SUMMARY

A method and apparatus for disassembling a set top box is disclosed. The method includes providing the set top box including: a top cover, a base, and cover retention clips, wherein the cover retention clips are V or U shaped for securing the top cover to the base, providing a release fixture including a retention clip release finger, inserting the release fixture into the set top box, disengaging the cover retention clips using the retention clip release finger, and removing the top cover from the base.

Embodiments of the invention are directed to an apparatus comprising: a top cover; a base; and cover retention clips, wherein the cover retention clips are V or U shaped for securing the top cover to the base. The apparatus can be configured to be disassembled with a release fixture comprising a retention clip release finger. The cover retention clips are secured by the top cover and snap into an aperture of the base. The release fixture further comprises guides for assisting an alignment of the apparatus with the release fixture. The release fixture fits in an opening of the base of the apparatus. The release fixture slides between a sidewall of the top cover and a vertical base frame sidewall. The release fixture contacts the cover retention clips and cause the cover retention clips to disengage. The release fixture engages the base and holds it down while the top cover is removed. The retention clip release finger, when engaged, fits into an aperture of the base. The cover retention clips include a bent portion that extends beyond an upper border of the aperture to prevent the retention clips from being tangled. Further, it follows that the apparatus can be configured to be disassembled by the release fixture having guides for assisting an alignment of the apparatus with the release fixture; to have an opening in the base for the retention clip release fingers; to have the release fixture slide between a sidewall of the top cover and a vertical base frame sidewall during disassembly; to have the release fixture contact the cover retention clips and cause the cover retention clips to disengage during disassembly; to have the release fixture engage the base and hold the base down while the top cover is removed during disassembly; to have the retention clip release finger, when engaged, fit into an aperture of the base; and to have the cover retention clips include a bent portion that extends beyond an upper border of the aperture to prevent the retention clips from being tangled during disassembly.

BRIEF DESCRIPTION OF THE DRAWINGS

A more detailed understanding can be had from the following description, given by way of example in conjunction with the accompanying drawings wherein:

FIG. 5 is a perspective view of the assembled apparatus and a release fixture according to WO2010008360A1;

DETAILED DESCRIPTION

It is to be understood that the figures and descriptions of embodiments have been simplified to illustrate elements that are relevant for a clear understanding of the invention, while eliminating other elements and steps that are well known in the art and do not facilitate a better understanding of the present invention.

Figure 1:
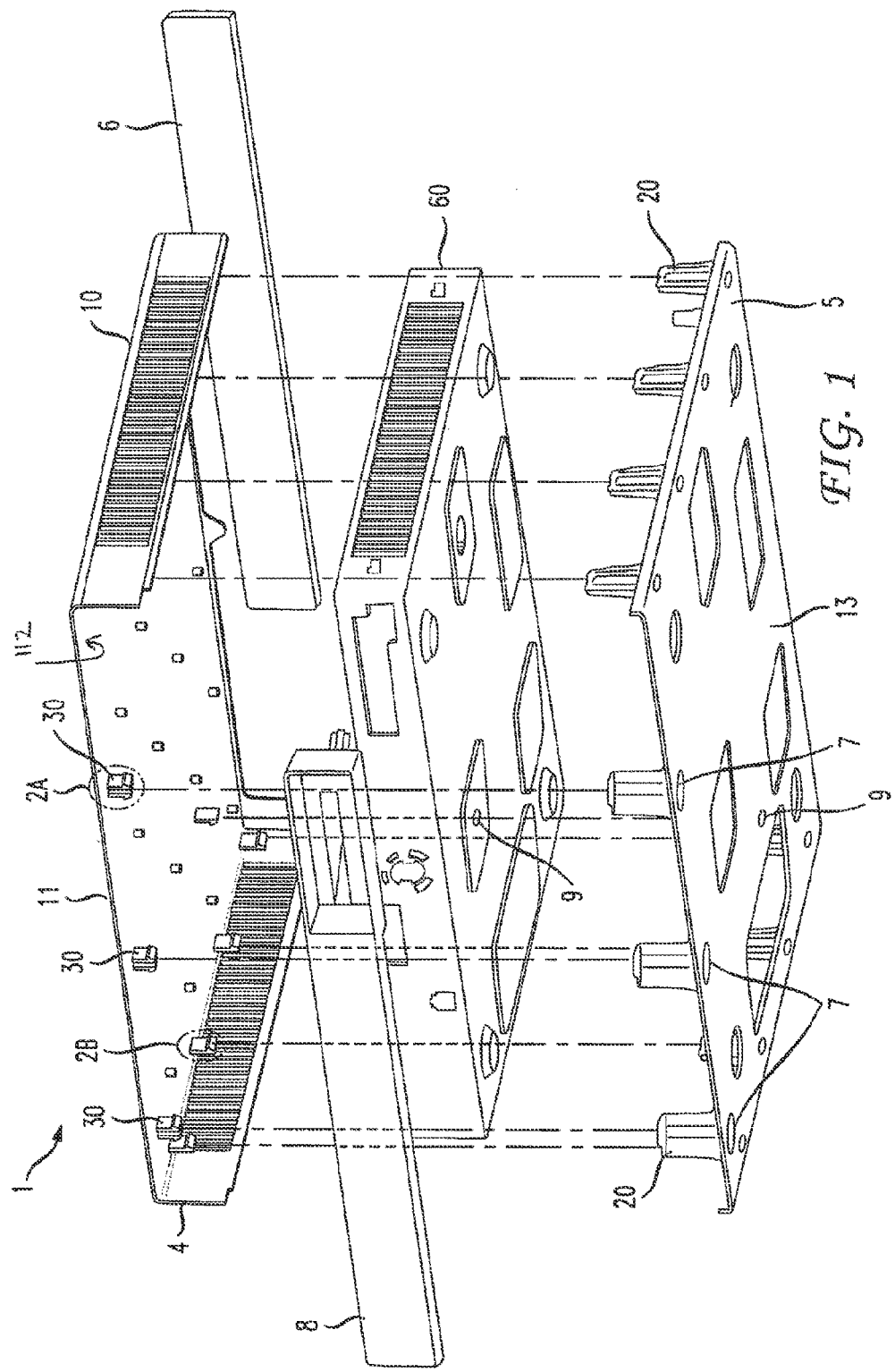
FIG. 1 is a perspective view of the apparatus according to WO2010008360A1 in a disassembled condition.
Figure 2A:
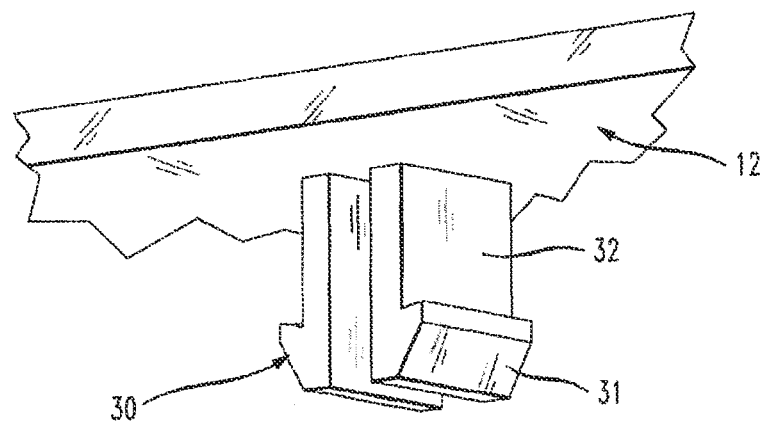
FIGS. 2A and 2B are an exploded view of the coupling clips of the apparatus of FIG. 1.
Figure 2B:
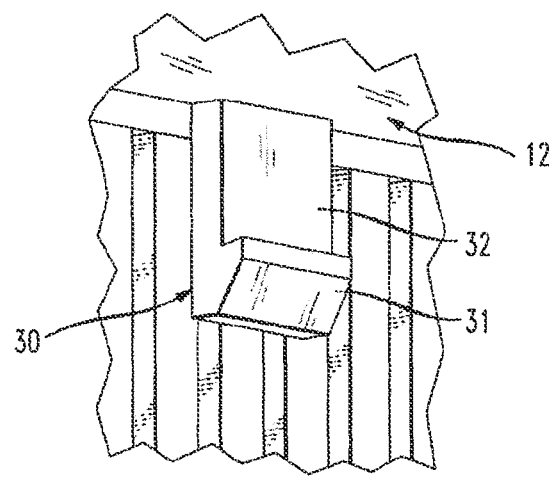
Figure 3:
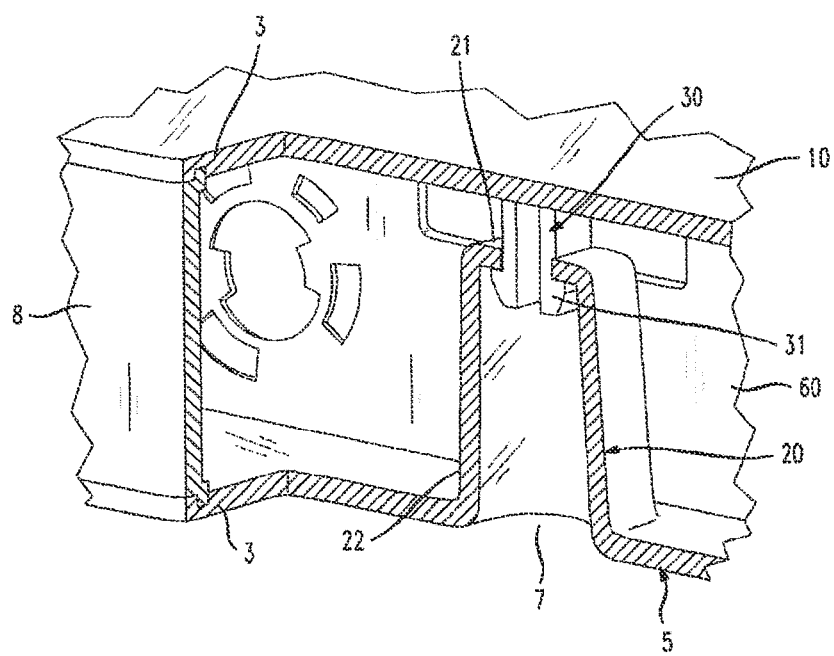
FIG. 3 is a perspective view of a coupling clip engaged in a clip receiving member of the assembled apparatus according to WO2010008360A1.
Figure 4:
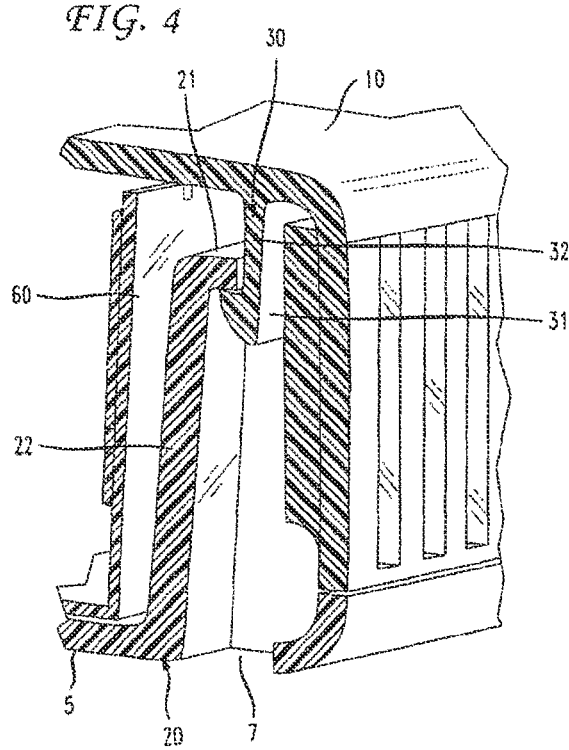
FIG. 4 is a perspective view of another coupling clip engaged in a clip receiving member of the assembled apparatus according to WO2010008360A1.
Figure 6A:
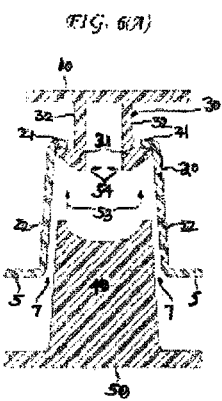
FIG. 6 is a cross-section of the apparatus and release fixture according to WO2010008360A1 during various steps of disassembly of the apparatus.
Figure 6B:
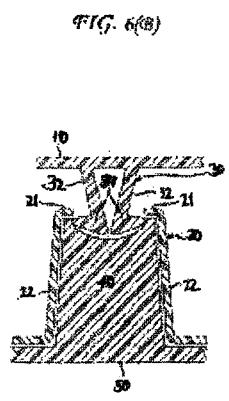
Figure 6C:
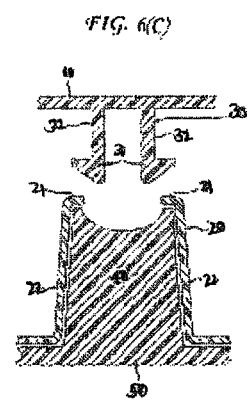
Figure 7A:
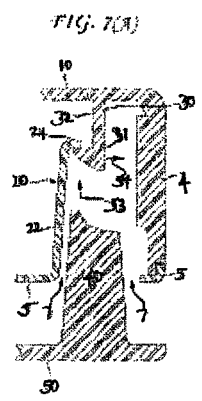
FIG. 7 is another cross-section of the apparatus and release fixture according to WO2010008360A1 during various steps of disassembly of the apparatus.
Figure 7B:
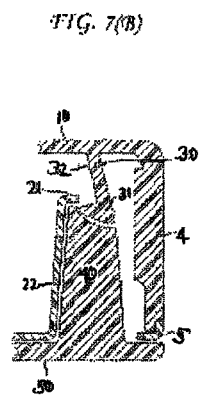
Figure 7C:
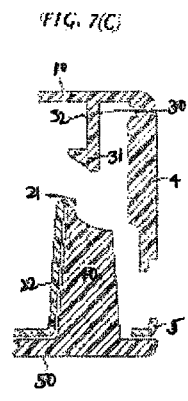
Figure 8:
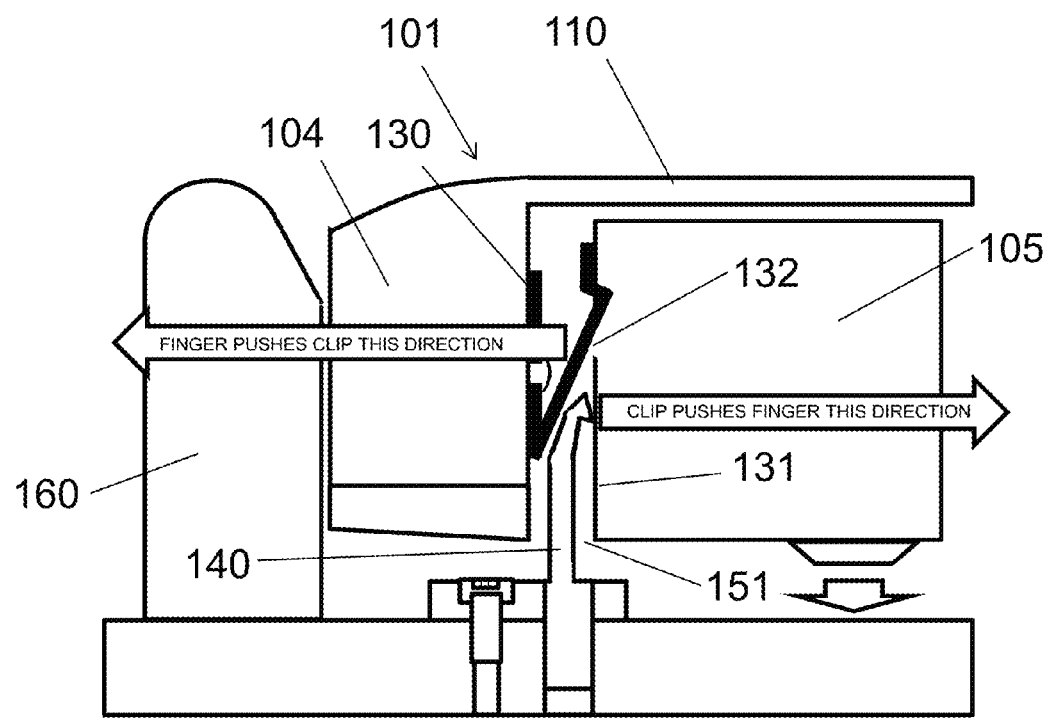
FIG. 8 is a side view of the present disclosure in which the assembled set top box or the like is being placed on the release fixture.

FIG. 8 is a side view of the present disclosure in which the assembled set top box or the like is being placed on the release fixture. FIG. 8 shows a side view of the present disclosure in which the assembled set top box 101 or the like is being placed on the release fixture 150.

The set top box 101 or electronic device can have a cover 110 with downwardly extending sidewalls 104. The sidewalls 104 can be designed to hold cover retention clips or coupling clips 130. The coupling clips 130 can have a bent shape, such as a v-shape or a u-shape, in which one side or prong of the V (or U) can be or can have a flat or straight profile. One side or prong of the V (or U) coupling clips 130 can be attached to the interior side of the sidewalls 104 in a vertical orientation. The second prong or other side of the V (or U) coupling clips 130 can extend upwardly and inwardly and have a bent end portion having a ledge that is shaped to snap into an aperture 132 in the vertical base frame sidewall 131 of the base 105 of the set top box 101. The ledge of the other prong of the V (or U) coupling clips 130 can be bent toward the first prong and can have a further bend upward such that the further bent portion is parallel to the first prong when the coupling clip 130 is engaged in the aperture 132. Having this further bent portion extend beyond the upper border of the aperture 132 can prevent the clip from being irreversibly tangled. This engagement can enable the cover 110 to be locked to the base 105 of the set top box 101, thereby securing the set top box 101 for use.

The release fixture 150 can be similar to that in WO2010008360A1. However, the decoupling members (or cover retention clip release finger) 140 can be designed to be positioned around the periphery of the base 105 and can be designed to be resilient. The release fixture 150 includes guides 160 which can be on three or four sides to assist in alignment of the set top box 101 with the release fixture 150. The decoupling members 140 can be designed (1) to fit in an opening 151 in the base 105 or in the bottom of the set top box 101, (2) to slide between the sidewalls 104 of the cover 110 and the vertical base frame sidewall 131, and (3) to contact the second prong of the coupling clips 130 to flex the second prong away from the vertical base frame sidewall 131, thereby causing the ledge to be removed from the aperture 132 of the base 105 and unlock the cover 110. The top portion of the decoupling member 140 can have a first sloped portion at the end of the decoupling member 140 that is angled upward and in toward the set top box 101. This slope portion can contact the second prong and cause the second prong to flex toward the first prong. The slope of the sloped portion of the decoupling members 140 can be the same as the slope of the second prong of the clips 130 (below the ledge portion) or the slopes can at least have the same sign.

Additionally, the decoupling member 140 can be flexible and have a second side opposite the first slope portion that faces inward toward the set top box 101. This second side can have a sloped upper portion extending from the end of the decoupling member 140 (opposite the base of the decoupling member) and have a ledge that extends toward the first sloped portion. The ledge and at least part of the sloped upper portion enters the aperture 131 can lock the set top box 101 through its base 105 to the fixture while simultaneously freeing the cover 110 for removal. The fixture 150 and set top box 101 can include a plurality of the decoupling clips and clips 140, respectively, and the engagement and disengagement can be intended to occur simultaneously.

Figure 9:
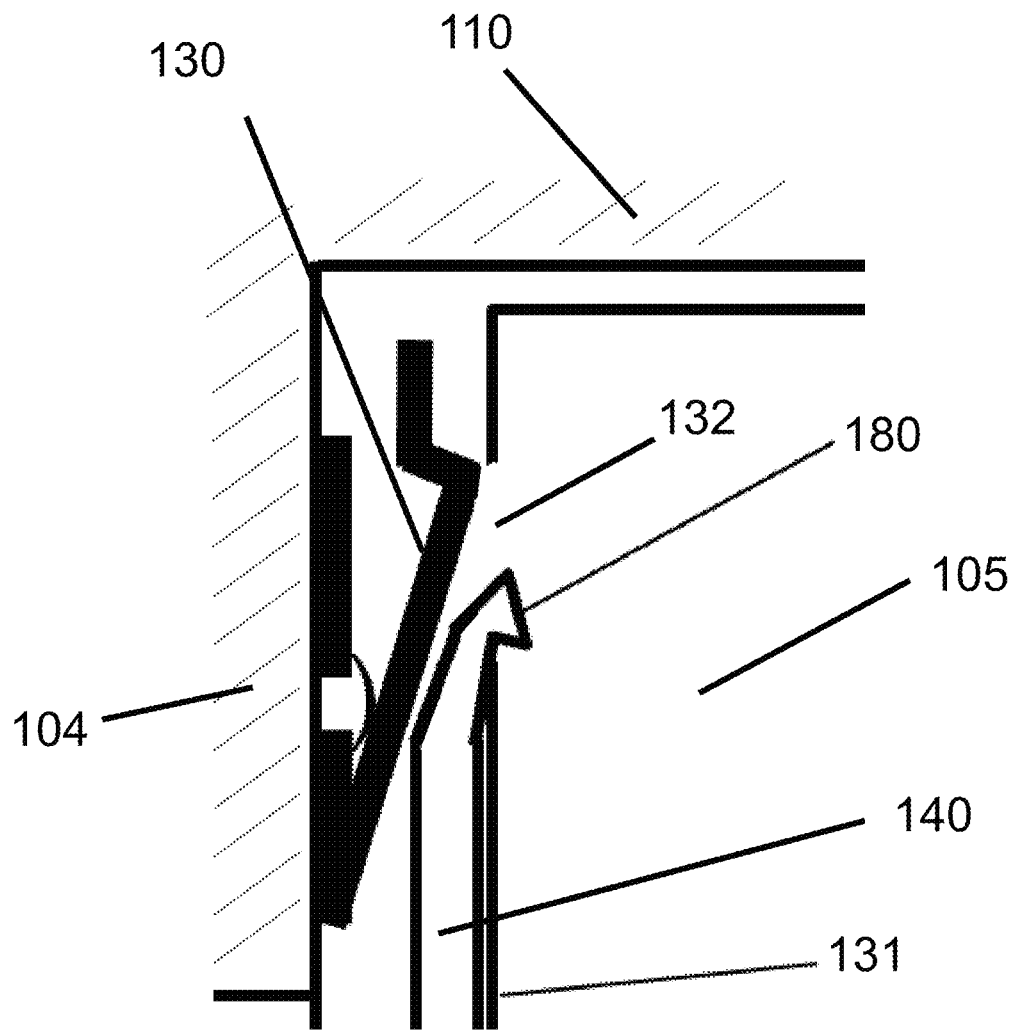
FIG. 9 is a side view of the present disclosure in which the set top box or the like is fully placed on the release fixture and is in condition for disassembly.

FIG. 9 is a side view of the present disclosure in which the set top box or the like is fully placed on the release fixture and is in condition for disassembly. FIG. 9 shows one of the plurality of decoupling clips and clips 130 that can interact simultaneously for the engagement and disengagement of clips 140. FIG. 9 shows that the aperture 132 can be designed such that an upper portion of the aperture 132 engages the coupling clip 130 to lock the cover 110 and a lower portion of the aperture 132 engages the decoupling member 140 to retain the base 105 to the release fixture 150 to unlock the cover 110. In other words, a latch or protrusion 180 on the back side of the cover retention clip release finger 140 that unlatches the coupling clips 130 on the cover 110 from the frame 105 (base) is pressed into the frame when the cover 110 is present. This action can retain the base 105 to the release fixture 150, allowing the cover 110 to be easily removed. When the cover 110 is removed, the coupling clips 130 on the cover 110 can also be removed, thereby allowing the base 105 to be easily removed from the release fixture 150.

Disassembly jigs or release fixtures can permit the cover to remain positioned on the base or frame when detached. However, the release fixture can hold the base while the cover is removed which can be advantageous because there will be some friction due to the tight fit that is desired to produce a smooth shape of the parts. Lifting the cover from the base while on the fixture pulls the base along with it, and clips reengage. This method can retain the base to the frame allowing cover removal. Once the cover is removed the latches automatically disengage from the base, allowing base removal from the fixture.

Although it can be advantageous to have the decoupling clips around the periphery some coupling clips can be positioned away from the periphery. This can make it more difficult to open the device without the proper release fixture.

Figure 10:
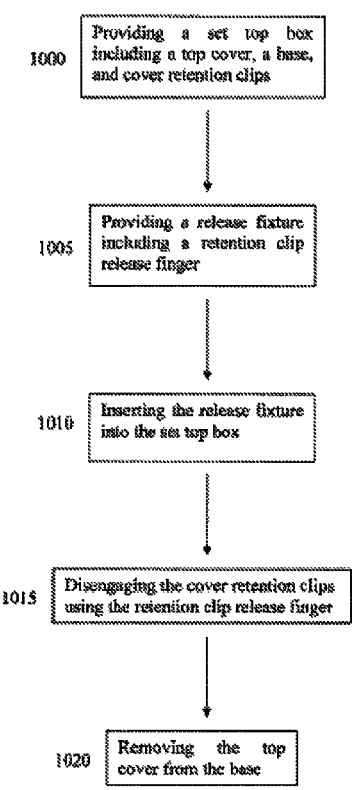
FIG. 10 is a flow diagram of an example method for disassembling a set top box using a disengagement fixture.

FIG. 10 is a flow diagram of an example method for disassembling a set top box using a disengagement fixture. As illustrated in FIG. 10, a method for disassembling a set top box can include providing a set top box including a top cover, a base, and cover retention clips (1000). The cover retention clips can be V or U shaped for securing the top cover to the base. The method can further include providing a release fixture including a retention clip release finger (1005). The method can further include inserting the release fixture into the set top box (1010). The method can further include disengaging the cover retention clips using the retention clip release finger (1015). The method can further include removing the top cover from the base (1020). After providing the set top box (1000), the method can include securing the top cover to the base by inserting the cover retention clips of the top cover into an aperture of the base.

While embodiments of the invention have been described, it will be appreciated that modifications of these embodiments are within the true spirit and scope of the invention. For example, a feature of the invention is that the set top box with the clips does not have any screws or bolts holding the cover to the frame. The invention is not limited to any particular element(s) that perform(s) any particular function (s) and some can not necessarily occur in the order shown. For example, in some cases two or more method steps can occur in a different order or simultaneously. These and other variations of the methods disclosed herein will be readily apparent, especially in view of the description of the method described herein, and are considered to be within the full scope of the invention.

The invention claimed is:
1. An electronic apparatus comprising:
a top cover having vertical sidewalls extending from a periphery of the top cover;
vertical base frame sidewalls extending upward from a periphery of a base, wherein the vertical base frame sidewalls are generally parallel to vertical sidewalls of the top cover and the vertical base frame sidewalls face respective interior surfaces of the vertical sidewalls of the top cover; and cover retention clips being V or U shaped for securing the top cover to the base, wherein a first side of the cover retention clips is attached directly to interior surfaces of the vertical sidewalls of the top cover and a second side of the cover retention clips engages apertures in the vertical base frame sidewalls to secure the base to the top cover, wherein the cover retention clips each comprise a bent portion that extends beyond an upper border of the apertures on a same side of the apertures as the vertical sidewall when engaged;

wherein the cover retention clips are releasable to disassemble the base from the top cover.

2. The electronic apparatus of claim 1, wherein the cover retention clips snap into the apertures of the vertical base frame sidewalls of the base.

3. The electronic apparatus of claim 2, wherein the electronic apparatus is further configured to have the cover retention clips include a bent portion that extends beyond an upper border of the aperture to prevent the retention clips from being tangled during disassembly.

4. The electronic apparatus of claim 2, wherein the cover retention clips include a bent portion that extends beyond an upper border of the aperture to prevent the retention clips from being tangled.

5. The electronic apparatus of claim 1, wherein the vertical sidewalls of the top cover form an external surface of the electronic apparatus.

6. The electronic apparatus of claim 1, wherein the electronic apparatus is configured to be disassembled with an external release fixture comprising:

a retention clip release finger that fits into the apertures of the vertical base frame sidewalls of the base when engaged and thereby holds the base down while the top cover is removed.

7. The electronic apparatus of claim 6, wherein the release fixture further comprises guides for assisting an alignment of the electronic apparatus with the release fixture.

8. The electronic apparatus of claim 6, wherein the release fixture fits in an opening of a bottom of the electronic apparatus.

9. The electronic apparatus of claim 6, wherein the release fixture contacts the cover retention clips and cause the cover retention clips to disengage.

10. The electronic apparatus of claim 6, wherein the electronic apparatus is further configured to be disassembled by the release fixture having guides for assisting an alignment of the electronic apparatus with the release fixture.

11. The electronic apparatus of claim 6, wherein the electronic apparatus is further configured to have the release fixture slide between the vertical sidewalls of the top cover and the vertical base frame sidewalls during disassembly.

12. The electronic apparatus of claim 6, wherein the electronic apparatus is further configured to have the release fixture contact the cover retention clips and cause the cover retention clips to disengage during disassembly.

13. The electronic apparatus of claim 6, wherein the electronic apparatus is further configured to have the release fixture engage the base and hold the base down while the top cover is removed during disassembly.

14. The electronic apparatus of claim 13, wherein the electronic apparatus is further configured to have the retention clip release finger, when engaged, fit into an opening in a bottom of the electronic apparatus.

15. An apparatus, comprising:

a top cover;

a base; and cover retention clips that are V or U shaped for securing the top cover to the base and that are secured by the top cover and snap into an aperture of the base, wherein the cover retention clips each comprise a bent portion that extends beyond an upper border of the aperture on a same side of the aperture as the top cover when snapped into the aperture, wherein the cover retention clips are releasable using an external retention clip release finger inserted into the aperture to separate the base from the top cover.

* * * * *

UNITED STATES PATENT AND TRADEMARK OFFICE
CERTIFICATE OF CORRECTION

| | |
|---|---|
| PATENT NO. | : 9,717,153 B2 |
| APPLICATION NO. | : 14/131718 |
| DATED | : July 25, 2017 |
| INVENTOR(S) | : William P. Dernier |

It is certified that error appears in the above-identified patent and that said Letters Patent is hereby corrected as shown below:

On the Title Page

1. Column 1, Line 1, item (54) replace; "FOR RETENTION BASE TO FIXTURE ON COVER REMOVAL FIXTURE" with --DESIGN FOR RETENTION BASE TO FIXTURE ON COVER REMOVAL FIXTURE--

In the Specification

1. Column 1, Line 1 (title) replace; "FOR RETENTION BASE TO FIXTURE ON COVER REMOVAL FIXTURE" with --DESIGN FOR RETENTION BASE TO FIXTURE ON COVER REMOVAL FIXTURE--

2. Column 1, Lines 7 – 13 replace; "This application is a National Stage Application and claims the benefit, under 35 U.S.C. § 365 of International Application PCT/US2012/046836 filed Jul. 16, 2012 which was published in accordance with PCT Article 21(2) on Jan. 24, 2013 in English, and which claims the benefit of U.S. Provisional Pat. App. Ser. No. 61/508,724filed on Jul. 18, 2011." with --This application is a National Stage Application under 35 U.S.C. § 371 of International Application PCT/US2012/046836, filed Jul. 16, 2012, which claims the benefit of U.S. Provisional Pat. App. Ser. No. 61/508,724 filed Jul. 18, 2011.--

Signed and Sealed this
Tenth Day of January, 2023

Katherine Kelly Vidal
*Director of the United States Patent and Trademark Office*